US008670056B2

(12) United States Patent
Kono et al.

(10) Patent No.: US 8,670,056 B2
(45) Date of Patent: Mar. 11, 2014

(54) SOLID-STATE IMAGING APPARATUS

(75) Inventors: Shoji Kono, Hachioji (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 202 days.

(21) Appl. No.: 12/935,313

(22) PCT Filed: Mar. 25, 2009

(86) PCT No.: PCT/JP2009/056763
§ 371 (c)(1),
(2), (4) Date: Sep. 29, 2010

(87) PCT Pub. No.: WO2009/123244
PCT Pub. Date: Oct. 8, 2009

(65) Prior Publication Data
US 2011/0169989 A1 Jul. 14, 2011

(30) Foreign Application Priority Data

Apr. 1, 2008 (JP) ................................. 2008-094999

(51) Int. Cl.
H04N 5/335 (2011.01)
(52) U.S. Cl.
USPC ............ 348/294; 348/300; 257/225; 257/292
(58) Field of Classification Search
USPC ........................................................ 348/300
See application file for complete search history.

(56) References Cited

U.S. PATENT DOCUMENTS

| 5,698,892 | A | 12/1997 | Koizumi et al. | 257/620 |
|---|---|---|---|---|
| 6,188,094 | B1 | 2/2001 | Kochi et al. | 257/232 |
| 6,211,509 | B1 * | 4/2001 | Inoue et al. | 250/208.1 |
| 6,433,374 | B1 * | 8/2002 | Fukunaga et al. | 257/292 |
| 6,670,990 | B1 | 12/2003 | Kochi et al. | 348/310 |
| 6,960,751 | B2 | 11/2005 | Hiyama et al. | 250/208.1 |
| 7,016,089 | B2 | 3/2006 | Yoneda et al. | 358/482 |
| 7,110,030 | B1 | 9/2006 | Kochi et al. | 348/308 |

(Continued)

FOREIGN PATENT DOCUMENTS

EP 1 455 389 A2 9/2004
JP 2004-266159 A 9/2004

(Continued)

OTHER PUBLICATIONS

Korean Office Action dated Jan. 3, 2012, in related Korean Patent Application No. 10-2010-7023614.

*Primary Examiner* — Timothy J Henn
*Assistant Examiner* — Abdelaaziz Tissire
(74) *Attorney, Agent, or Firm* — Fitzpatrick, Cella, Harper & Scinto

(57) ABSTRACT

A solid-state imaging apparatus capable of suppressing blooming and color mixing includes a plurality of pixels, each including a photoelectric converting portion and a transferring portion for transferring signal electrons from the photoelectric converting portion, wherein a plurality of the photoelectric converting portions is formed in a first conductivity type well region formed on the semiconductor substrate; a second conductivity type first impurity region is arranged between the adjacent photoelectric converting portions; a first conductivity type second impurity region having an impurity concentration higher than that of the well region is arranged between the first impurity region and each of the photoelectric converting portions; and a first conductivity type third impurity region having an impurity concentration higher than that of the well region and decreasing from the semiconductor substrate toward the surface direction of the apparatus between the semiconductor substrate and the first impurity region.

9 Claims, 6 Drawing Sheets

(56) References Cited

U.S. PATENT DOCUMENTS

| | | |
|---|---|---|
| 7,227,208 B2 | 6/2007 | Ogura et al. .................. 257/292 |
| 7,321,110 B2 | 1/2008 | Okita et al. ................. 250/208.1 |
| 7,324,144 B1 | 1/2008 | Koizumi ....................... 348/294 |
| 7,348,615 B2 | 3/2008 | Koizumi ....................... 257/292 |
| 7,408,210 B2 | 8/2008 | Ogura et al. .................. 257/233 |
| 7,429,764 B2 | 9/2008 | Koizumi et al. ............. 257/292 |
| 7,460,162 B2 | 12/2008 | Koizumi et al. ............. 348/294 |
| 7,466,003 B2 | 12/2008 | Ueno et al. ................... 257/462 |
| 7,538,810 B2 | 5/2009 | Koizumi et al. ............. 348/308 |
| 7,550,793 B2 | 6/2009 | Itano et al. .................... 257/239 |
| 7,554,591 B2 | 6/2009 | Kikuchi et al. .............. 348/308 |
| 7,605,415 B2 | 10/2009 | Koizumi et al. ............. 257/291 |
| 7,629,568 B2 | 12/2009 | Koizumi et al. .......... 250/214 R |
| 7,808,537 B2 | 10/2010 | Fujimura et al. ............ 348/300 |
| 2004/0173824 A1* | 9/2004 | Nagasaki et al. ............. 257/255 |
| 2005/0035375 A1* | 2/2005 | Hirata ........................... 257/225 |
| 2005/0168604 A1 | 8/2005 | Mishina et al. |
| 2005/0253214 A1 | 11/2005 | Nagasaki et al. |
| 2005/0269604 A1* | 12/2005 | Koizumi et al. ............. 257/291 |
| 2006/0065896 A1* | 3/2006 | Abe et al. ....................... 257/69 |
| 2006/0157759 A1 | 7/2006 | Okita et al. ................... 257/292 |
| 2007/0108487 A1* | 5/2007 | Inoue et al. ................... 257/292 |
| 2008/0036891 A1 | 2/2008 | Ono et al. ..................... 348/308 |
| 2008/0062294 A1 | 3/2008 | Koizumi et al. ............. 348/300 |
| 2008/0062296 A1 | 3/2008 | Ogura et al. .................. 348/308 |
| 2008/0142856 A1* | 6/2008 | Sato et al. ..................... 257/292 |
| 2009/0073298 A1 | 3/2009 | Ogura et al. .................. 348/308 |
| 2009/0207293 A1 | 8/2009 | Ryoki et al. .................. 348/308 |
| 2010/0002114 A1 | 1/2010 | Ogura et al. .................. 348/301 |
| 2010/0060754 A1 | 3/2010 | Ogura et al. .................. 348/241 |
| 2010/0066881 A1 | 3/2010 | Ryoki et al. .................. 348/302 |
| 2010/0194947 A1 | 8/2010 | Ogura et al. .................. 348/301 |
| 2010/0225793 A1 | 9/2010 | Matsuda et al. .............. 348/280 |
| 2010/0264298 A1 | 10/2010 | Ryoki et al. ................ 250/208.1 |

FOREIGN PATENT DOCUMENTS

| | | |
|---|---|---|
| JP | 2005-229105 A | 8/2005 |
| JP | 2006-024907 A | 1/2006 |
| KR | 10-2005-0109050 A | 11/2005 |
| KR | 10-2006-0042901 A | 5/2006 |

* cited by examiner

FIG. 1

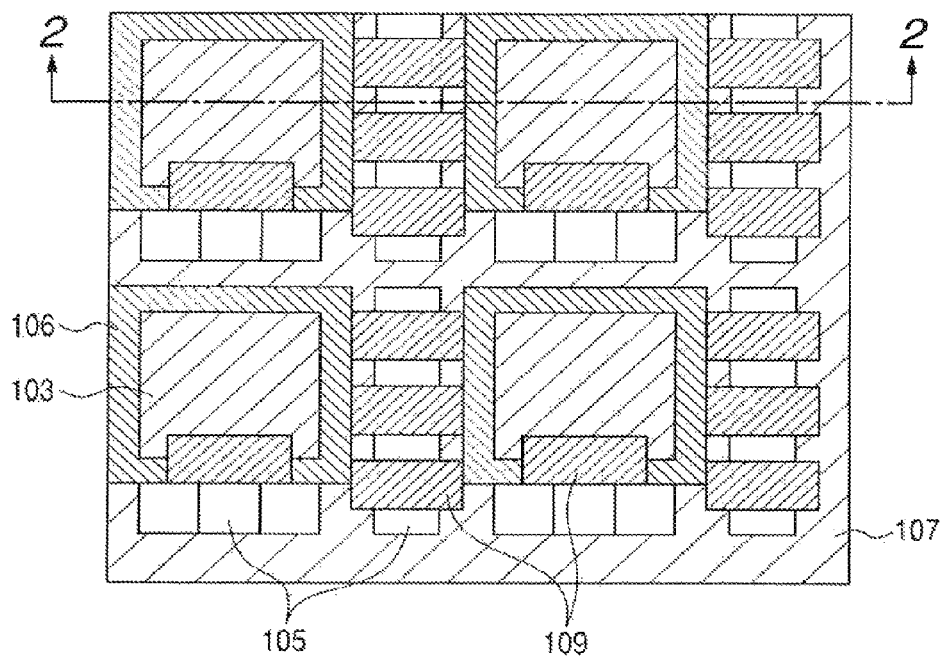

FIG. 2

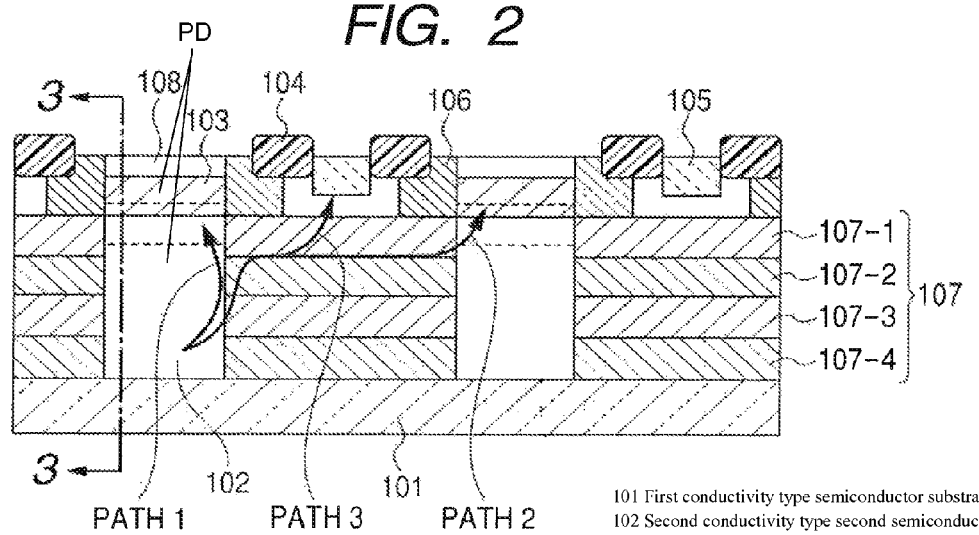

101 First conductivity type semiconductor substrate
102 Second conductivity type second semiconductor region
103 First conductivity type first semiconductor region
104 Element isolation region
105 First conductivity type third semiconductor region
106 Second conductivity type fourth semiconductor region
107 Second conductivity type fifth semiconductor region
108 Second conductivity type sixth semiconductor region
109 Wiring layer
PD Photodiode 1400 Photodiode
1401 Transfer transistor
1402 Reset transistor
1403 Amplifying transistor
1404 Selection transistor
1406 Output line
1410 Pixel
FD   Floating diffusion
Vcc  Power Source Line

SOLID-STATE IMAGING APPARATUS

TECHNICAL FIELD

The present invention relates to a solid-state imaging apparatus converting an image into an electric signal. In particular, the present invention relates an active pixel sensor (hereinafter referred to as "APS"), including an amplifier in each pixel or in every plurality of pixels.

BACKGROUND ART

A solid-state imaging apparatus of an APS structure is also called as a CMOS sensor, and is widely used for digital cameras and the like.

A conventional solid-state imaging apparatus has the problem of the following phenomena. To put it concretely, the phenomena are a blooming phenomenon, in which signal charges escape into an adjacent photoelectric converting portion, the color mixing, in which color reproducibility worsens by the blooming phenomenon, and the like. The generating mechanisms of these phenomena are severally as follows: the signal charges accumulated in a semiconductor region constituting a photoelectric converting portion for accumulating signal charges (N type semiconductor region in the case where the signal charges are electrons) become a saturation state, and overflowing signal charges go over an element isolation region to arrive at an adjacent pixel.

In order to settle the problem mentioned above, Japanese Patent Application Laid-Open No. 2004-266159 (hereinafter referred to as Patent Document 1) discloses the configuration in which a deep isolation injection layer is formed under the element isolation region. The Patent Document 1 describes the configuration of obstructing the effluences of signal charges from a photodiode.

Moreover, Japanese Patent Application Laid-Open No. 2005-229105 (hereinafter referred to as Patent Document 2) discloses the following configuration. That is, an overflow path region is formed under an element isolation insulation film, and the overflow path region is made to have a piece of potential lower than that of a P type well region constituting a photodiode. Thus, the photodiode overflows with signal charges, which are discharged to an N type silicon substrate, to suppress the blooming.

Moreover, in addition, also Japanese Patent Application Laid-Open No. 2006-024907 (hereinafter referred to as Patent Document 3) describes an element isolation structure suppressing the escaping of signal charges.

However, in the case of forming the diffusion layer for element isolation as the one disclosed in the Patent Document 1 mentioned above, since the element isolation diffusion layer having a sufficient width cannot obtained as the miniaturization of a pixel progresses, sufficient color mixing and blooming suppressing effects cannot be obtained sometimes.

Moreover, if the overflow path region disclosed in the Patent Document 2 mentioned above is formed, the signal charges generated by a photoelectric conversion at a deep part of a well are sometimes discharged when the P well constituting the photodiode is deeply formed, and the sensitivity of the photodiode does not sometimes become high.

Moreover, also by the element isolation structure disclosed in the Patent Document 3, the signal charge collecting efficiency cannot be said yet to be sufficient, and there is room for further examination.

DISCLOSURE OF THE INVENTION

The present invention is based on the concept of providing the optimum element isolation structure according to the depth and concentration of a P type well constituting a photodiode. The present invention is directed to provide a solid-state imaging apparatus capable of suppressing blooming and color mixing even if the sensitivity of the photoelectric converting portion of a photodiode or the like is improved.

An object of the present invention is to provide a solid-state imaging apparatus comprising a plurality of pixels, each pixel including a photoelectric converting portion for converting an incident light into signal charges and a transferring portion for transferring the signal charge from the photoelectric converting portion, wherein the photoelectric converting portion and the transferring portion are arranged at least on a semiconductor substrate, the photoelectric converting portion includes a first semiconductor region of a first conductivity type for accumulating the signal charge and a second semiconductor region of a second conductivity type forming PN junction with the first semiconductor region, a third semiconductor region of the first conductivity type is arranged between adjacent first semiconductor regions, a fourth semiconductor region of the second conductivity type and of an impurity concentration higher than that of the second semiconductor region is arranged between the first and third semiconductor regions, and a fifth semiconductor region of the second conductivity type, and of an impurity concentration higher than that of the second semiconductor region, to form an impurity concentration profile such that the impurity concentration gradually decreases toward a surface direction is arranged under the third semiconductor region.

The other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a planar layout view of pixels in a first embodiment.

FIG. 2 is a cross-sectional structure diagram of the first embodiment taken along a line 2-2 in FIG. 1.

Figure 3:
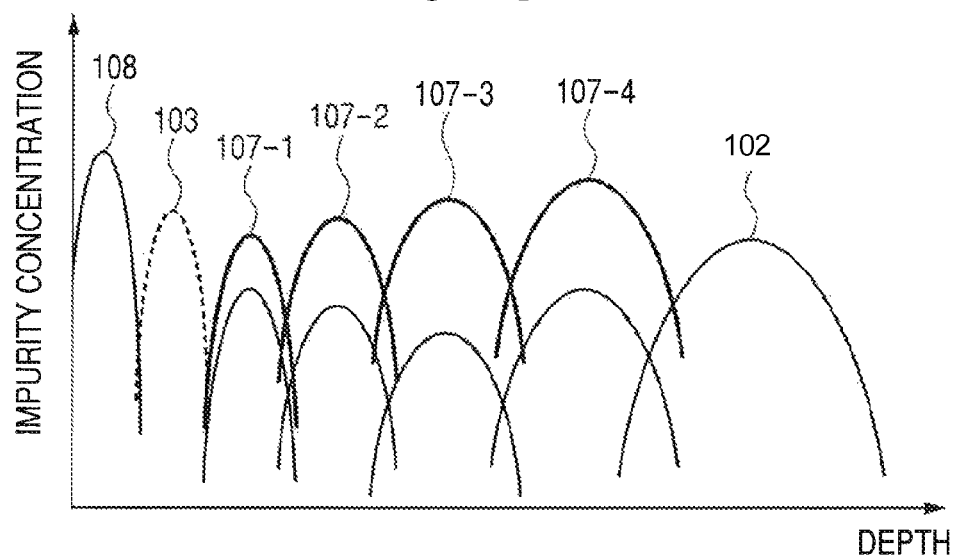
FIG. 3 is a concentration profile of a P type well and a second P type element isolation diffusion layer of the first embodiment.

The accompanying drawings, which are incorporated in and constitute a part of the specification, illustrate embodiments of the invention and, together with the description, serve to explain the principles of the invention.

BEST MODE FOR CARRYING OUT THE INVENTION

In the following, the exemplary embodiments of the solid-state imaging apparatus of the present invention will be described in detail with reference to the accompanying drawings.

A first embodiment of the present invention is described. The semiconductor substrate in the following description indicates a part to be a base on which each semiconductor region is formed, and a device is formed on the surface part of the semiconductor substrate. To put it concretely, the semiconductor substrate is denoted by a reference numeral 101 in FIG. 2. Moreover, it is supposed that the whole configuration including the semiconductor substrate 101 and a principal plane on which the device is formed is called as the semiconductor substrate. To put it concretely, the whole configuration including the portions denoted by reference numerals 101-108 in FIG. 2 is supposed to be called as the semiconductor substrate.

Furthermore, it is supposed that the principal plane on which the device of the semiconductor substrate 101 is formed is taken as the criterion of the depth of each semiconductor region in the semiconductor substrate when the depth is described, and it is supposed that the depth becomes deeper when a position becomes distant from the principal plane. Moreover, when a position is defined by the upper and lower sides, a position closer to the principal plane on which the device of the semiconductor substrate 101 is formed is defined as the upper side.

Figure 9:
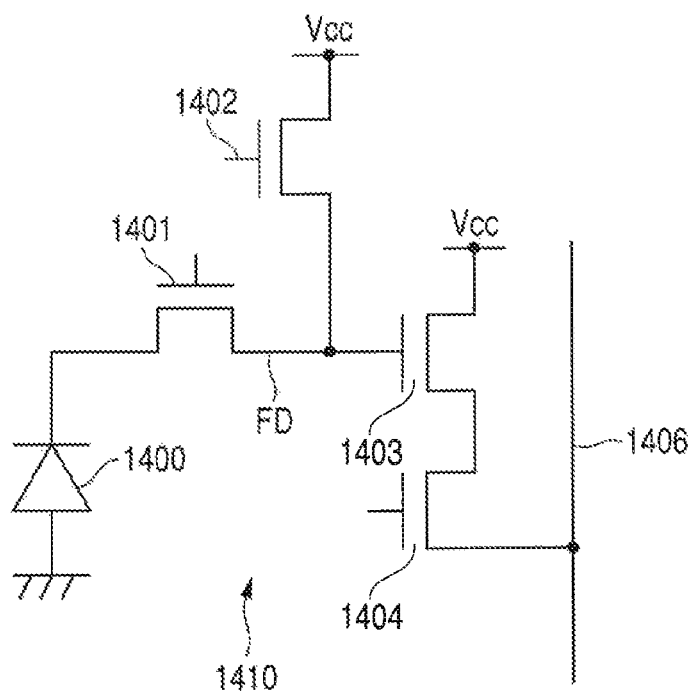
FIG. 9 is an example of an equivalent circuit diagram of a pixel applicable to the present invention.

First, FIG. 9 illustrates an example of an equivalent circuit diagram of pixels applicable to the present invention. In FIG. 9, each pixel is denoted by a reference numeral 1410.

The pixel 1410 includes a photodiode 1400, which functions as a photoelectric converting portion, a transfer transistor 1401, a reset transistor 1402, an amplifying transistor 1403, and a selection transistor 1404. The pixel further includes a power source line Vcc and an output line 1406.

The anode of the photodiode 1400 is connected to the grounding wire, and the cathode of the photodiode 1400 is connected to the source of the transfer transistor 1401. Moreover, the source of the transfer transistor 1401 may be configured in the semiconductor region shared by the cathode of the photodiode.

The drain of the transfer transistor 1401 is connected to the floating diffusion (hereinafter referred to as FD) region, and the gate of the transfer transistor 1401 is connected to a transfer control line. Furthermore, the drain of the reset transistor 1402 is connected to the power source line Vcc, and the source of the reset transistor 1402 is connected to the FD region. The gate of the reset transistor 1402 is connected to a reset control line. The drain of the transfer transistor 1401 and the FD region, or the drain of the reset transistor 1402 and the FD region may be configured in a common semiconductor region.

The drain of the amplifying transistor 1403 is connected to the power source line Vcc, and the source of the amplifying transistor 1403 is connected to the drain of the selection transistor 1404. The gate of the amplifying transistor 1403 is connected to the FD region. The drain of the selection transistor 1404 is connected to the source of the amplifying transistor 1403, and the source of the selection transistor 1404 is connected to the output line 1406. The gate of the selection transistor 1404 is connected to a vertical selection line driven by a vertical selection circuit (not illustrated).

Next the operation of the equivalent circuit is described. In the photodiode 1400, pairs of electrons and holes are generated by an incident light. An electric charge, one of each of these pairs, is used to as a signal charge to be transferred by the transfer transistor 1401 to the FD region. The gate potential of the amplifying transistor 1403 changes according to the transferred signal charge quantity. The amplifying transistor 1403 outputs an amplified signal to output line 1406 by the source follower circuit, which the amplifying transistor 1403 constitutes with a not-illustrated constant current source, on the basis of the potential change of the gate of the amplifying transistor 1403. The selection transistor 1404 controls the output from each pixel.

The circuit configuration illustrated here can be applied to all of the embodiments of the present invention. Furthermore, the following modifications can be considered. For example, the above circuit configuration can be applied to the configuration of lacking the transfer transistor 1401 with the photodiode 1400 connected to the gate of the amplifying transistor 1403 directly and the circuit configuration of sharing the amplifying transistor 1403 with a plurality of pixels. Moreover, also the configuration of being not provided with the selection transistor 1404 but performing the selection of a pixel by controlling the gate potential of the amplifying transistor 1403 may be adopted.

Next, the planar structures and the cross-sectional structures of pixels will be described with reference to FIGS. 1-3. FIG. 1 is a planar layout view of the pixels. FIG. 2 is a cross-sectional structure diagram taken along a line 2-2 in FIG. 1. FIG. 3 is an impurity concentration profile along a line 3-3 in FIG. 2.

A reference symbol 101 denotes a first conductivity type semiconductor substrate. A reference symbol 103 denotes a first conductivity type first semiconductor region. A reference symbol 102 denotes a second conductivity type second semiconductor region. The first semiconductor region 103 and the second semiconductor region 102 constitute a PN junction, and constitute a photodiode (PD) functioning as a photoelectric converting portion.

A reference symbol 105 denotes a first conductivity type third semiconductor region. The third semiconductor region 105 functions as the source region, the drain region, or the FD region of any of the MOS transistors constituting the above-mentioned pixel.

A reference symbol 104 denotes an element isolation region made of an insulator. The element isolation region 104 isolates the first semiconductor region 103 and the third semiconductor region 105 from each other. By the element isolation region 104, the active region in which a device is formed in the semiconductor substrate is defined.

A reference symbol 106 denotes a second conductivity type fourth semiconductor region. The fourth semiconductor region 106 is arranged under the element isolation region 104 between the first semiconductor region 103 and the third semiconductor region 105, and functions as an element isolation structure together with the element isolation region 104. Moreover, the fourth semiconductor region 106 also has the function of suppressing the dark current generated in the neighborhood of the element isolation region 104. Moreover, the impurity concentration of the fourth semiconductor region 106 is higher than that of the second semiconductor region 102.

A reference symbol 107 denotes a second conductivity type fifth semiconductor region. The fifth semiconductor region 107 is arranged under the third semiconductor region 105, and the impurity concentration of the fifth semiconductor region 107 is higher than that of the second semiconductor region 102. Furthermore, the fifth semiconductor region 107 is configured so that the impurity concentration thereof may decrease toward the surface direction of the pixel. The fifth semiconductor region 107 includes a plurality of semiconductor regions, each arranged in a different depth from the others' here. As long as at least the impurity concentration of the semiconductor region arranged at the shallowest portion is lower than that of the semiconductor region arranged at the deepest portion, the effects of the present invention can be obtained.

A reference symbol 108 denotes a second conductivity type sixth semiconductor region arranged in the first semiconductor region 103. The sixth semiconductor region 108 is the region for making the photoelectric converting portion a buried-type photodiode.

A reference symbol 109 denotes a wiring layer, and the wiring layer 109 functions as the gate electrodes of the MOS transistors constituting the above-mentioned pixel.

In the following, the structure and the function of the fifth semiconductor region 107, which is the feature of the present embodiment, will be minutely described. The fifth semiconductor region 107 has the following features.

(1) The fifth semiconductor region 107 extends to the neighborhood of the first conductivity type semiconductor substrate 101 or contacts with the semiconductor substrate 101.

(2) The fifth semiconductor region 107 is arranged under the third semiconductor region 105.

(3) The impurity concentration of the fifth semiconductor region 107 is higher than that of the second semiconductor region 102.

(4) The closer to a principal plane of the semiconductor substrate 101 a position is, the lower the impurity concentration of the fifth semiconductor region 107 becomes. That is, the impurity concentration of the fifth semiconductor region 107 becomes the highest at the deepest portion.

According to the features (1) and (3), the arrangement of a potential barrier between adjacent first semiconductor regions 103 enables the suppression of the effluences of the signal charges existing in the second semiconductor region 102 into an adjacent second semiconductor region 102. That is, as illustrated by a path 1 in FIG. 2, the fifth semiconductor region 107 functions as the potential barrier to the signal charges. In this way, the escaping of signal charges into adjacent pixels through paths 2, which escaping have much existed conventionally, is suppressed, and thereby blooming and color mixing can be suppressed. Thereby the sensitivity of the pixel can be improved.

According to the features (2) and (4), the signal charges escaping into an adjacent pixel through the path 2 in FIG. 2 can be led to a path 3, and the escapes of the signal charges through the path 2 can be hereby suppressed as a result.

In the following, the features mentioned above will be further minutely described.

As the result of the examination of the inventors of the present invention, it was found that the suppression ratio of the signal charges flowing into adjacent pixels were in proportion to the following formula (1).

$$\int_0^L x \times N(x) dx \quad (1)$$

The letter L denotes the width of the fifth semiconductor region 107 here. The width means the length of a straight line in the direction parallel to the straight line connecting two adjacent first semiconductor regions 103. The width indicates the width of the potential barrier between the adjacent first semiconductor regions 103, and is the length of about 1 to 3 μm, although the length depends on a pixel pitch. Moreover, the letter x denotes the length in the width direction of the fifth semiconductor region 107, and the symbol $N(x)$ indicates the difference between the impurity concentration at a point x in the fifth semiconductor region 107 and the impurity concentration of the second semiconductor region 102. The point x is supposed here to be zero at the boundary of the fifth semiconductor region 107 with the pixel.

Figure 7:
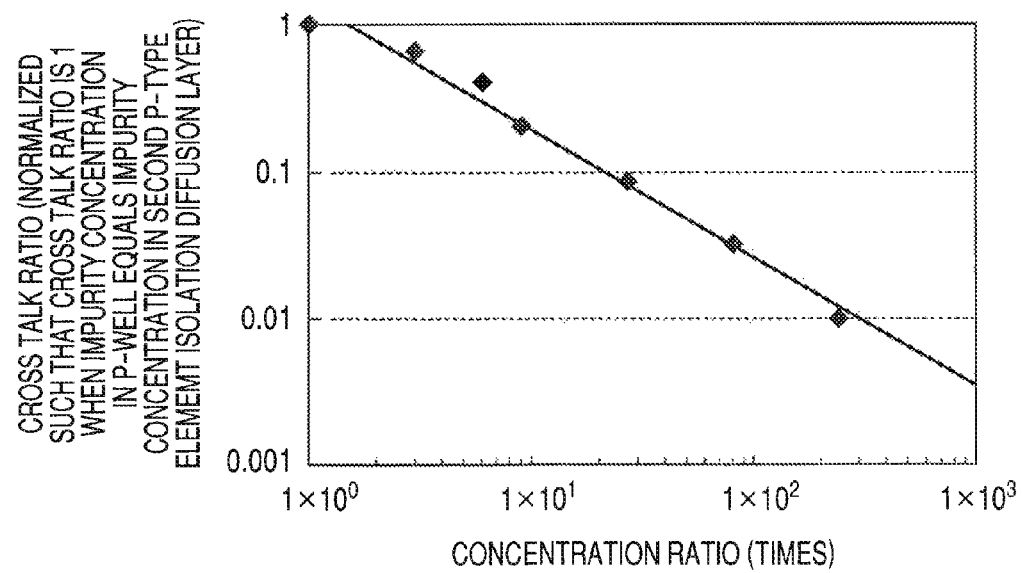
FIG. 7 is a graph illustrating impurity concentration heights and electron suppressing ratios of the second P type element isolation diffusion layer to the impurity concentrations of a P type well.

As the feature (3) mentioned above, it is known from the formula (1) that the more the impurity concentration of the fifth semiconductor region 107 becomes larger than that of the second semiconductor region 102, the more the possibility of the suppression of the escapes of the signal charges into the adjacent pixels becomes larger. A concrete example pertaining to the above is illustrated in FIG. 7. FIG. 7 illustrates a relation between the ratios of the impurity concentrations of the fifth semiconductor region 107 to the impurity concentrations of the second semiconductor region 102 and the cross talk ratios to adjacent pixels. As known from FIG. 7, the cross talk ratios become smaller almost in proportion to the heights of the concentrations of the fifth semiconductor region 107. That is, the amounts of the escapes of the signal charges decrease. Then it is desirable that the fifth semiconductor region 107 is wider in width than that of the fourth semiconductor region 106, and higher in impurity concentration than that of the fourth semiconductor region 106. Hereby, the effects mentioned above can be sufficiently obtained.

As described above, according to the features (1) and (3), the escapes of the signal charges to the adjacent pixels are prevented, and thereby the amount of the signal charges that behave the passing of the path 1 can be more increased, and the color mixing suppression and the sensitivity improvement can be achieved.

If the suppression ratio is tried to be improved by heightening the impurity concentration at a shallow portion in the fifth semiconductor region 107, the following side effect is sometimes produced. In FIG. 2, the part of the fifth semiconductor region 107 closest to the principal plane of the semiconductor substrate 101 and the third semiconductor region 105 are close to each other. The third semiconductor region 105 is used for the source regions and the drain regions of the MOS transistors constituting the pixel as mentioned above. Consequently, if the impurity concentration of the fifth semiconductor region 107 is made to be higher on the whole, then a shallow portion of the fifth semiconductor region 107 and the third semiconductor region 105 close to the shallow portion form a PN junction. Hereby a high concentration PN junction is formed, and the PN junction sometimes exerts undesirable influences on the characteristics of the MOS transistors. Moreover, the phenomenon in which the PN junction suppresses the expansion of the depletion layer extending from the first semiconductor region 103 constituting the photodiode can happen.

On the other hand, as illustrated in FIG. 3, the impurity concentration of the region of the fifth semiconductor region 107 close to the principal plane of the semiconductor substrate 101 is decreased. Hereby, the signal charges escaping through the path 2 in FIG. 2 are suppressed, and the signal charges behaving to pass through the path 3 can be increased. That is, it is desirable to form the fifth semiconductor region 107 as a multi-layer structure in which layers are stacked at different depths so that their impurity concentrations may become gradually higher from the principal plane side of the semiconductor substrate 101 toward the semiconductor substrate 101. For example, as illustrated in FIG. 2, the fifth semiconductor region 107 may be in the form of stacking a plurality of semiconductor regions 107-1, 107-2, 107-3, and 107-4 from the principal surface of the semiconductor substrate 101 so that the impurity concentration of each region may become gradually higher. Hereby, furthermore, blooming and color mixing can be suppressed. In order to maximize the effect of the feature (4), the fifth semiconductor region 107 is desirably arranged under the third semiconductor region 105 so as to discharge escaping signal charges to the adjacent pixels without making them escape. The structure of the feature (2) is effective therefor.

Moreover, as illustrated in FIG. 3, the second semiconductor region 102 may be configured of a plurality of semiconductor regions the impurity concentrations of which are difference from one another (the impurity concentration peaks of which have different values from one another). For example, if the impurity concentration of the fifth semiconductor region 107 cannot be made to be higher so much, then the following configuration can be adopted. That is, a low impurity concentration portion is formed in the second semiconductor region 102 so that the difference of the impurity concentrations of both the adjacent second semiconductor region 102 and the fifth semiconductor region 107 may be larger. By such a configuration, the difference of the concentrations of both of them can be controlled to raise the suppression effect.

Moreover, the extension of the deepest portion of the fifth semiconductor region 107 to the portion deeper than the deepest portion of the second semiconductor region 102 enables the effect mentioned above to be surer.

Incidentally, if the signal charge is supposed to be the electron, then the conductivity type of the first conductivity type may be set to the N type, and the conductivity type of the second conductivity type may be set to the P type. If the signal charge is supposed to be the hole, then the first conductivity type may be set to the P type, and the second conductivity type may be set to the N type.

Figure 4:
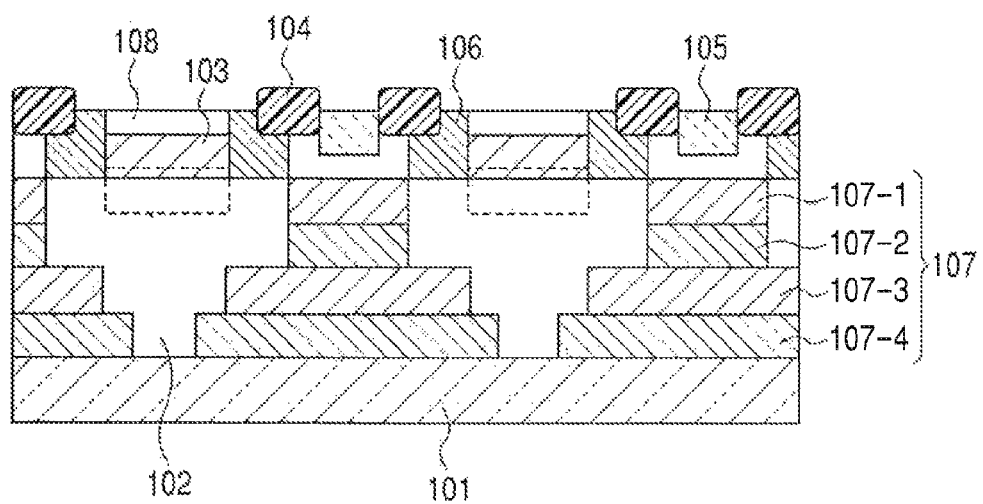
FIG. 4 is a cross-sectional structure diagram of pixels in a second embodiment.

Next, as a second embodiment of the solid-state imaging apparatus of the present invention, the apparatus having the structure illustrated in FIG. 4 will be described.

The structure can suppress color mixing and blooming effectively even in a pixel the pixel pitch of which is small. In the structure of FIG. 4, the deeper a position of the fifth semiconductor region 107 from the principal plane of the semiconductor substrate 101 becomes, the wider the width of the layer becomes. The structure enables the suppression of the color mixing and the blooming without suppressing the extension of the depletion layer extending from the first semiconductor region 103 constituting a photodiode.

Figure 5:
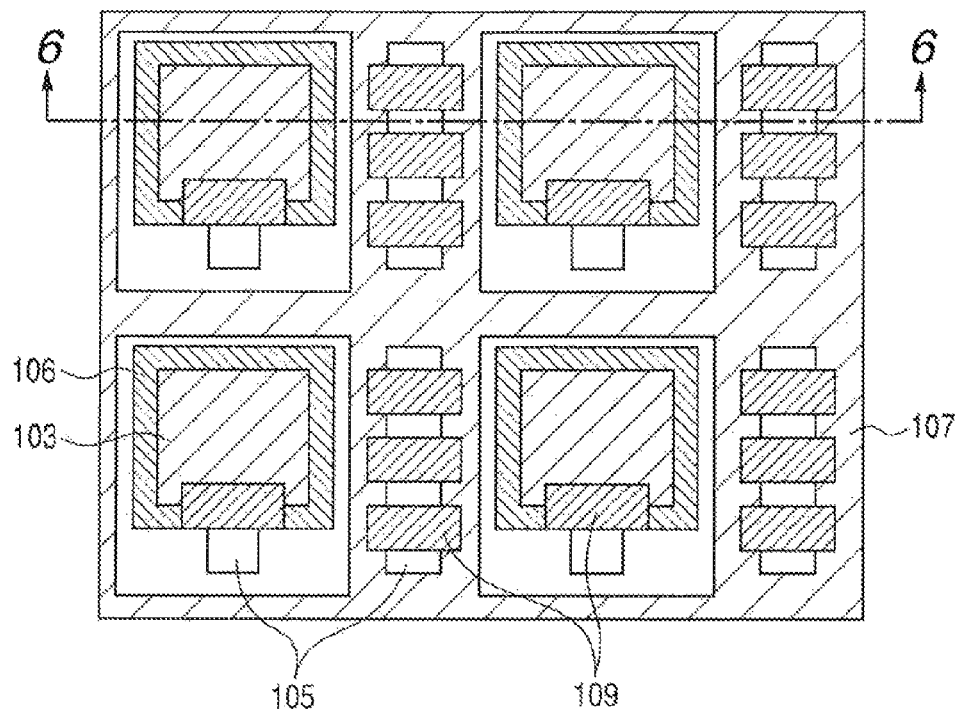
FIG. 5 is a planar layout view of pixels in a third embodiment.
Figure 6:
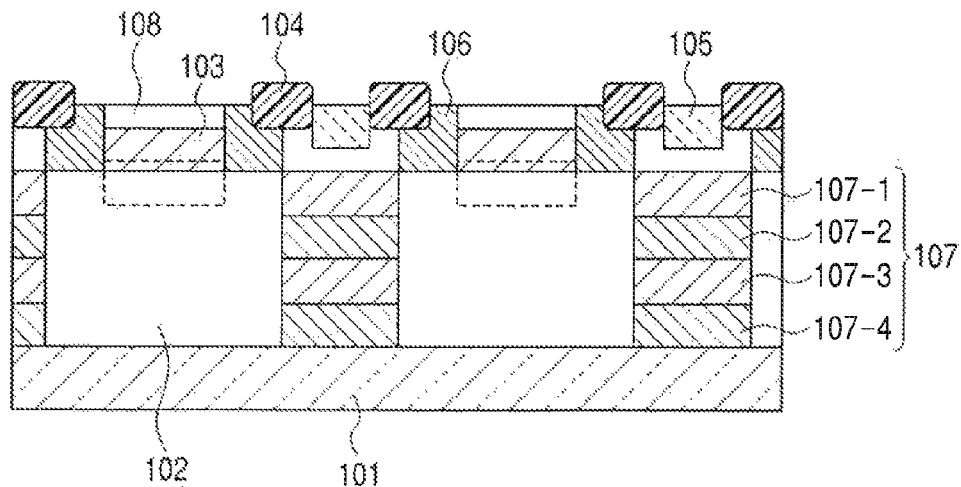
FIG. 6 is a cross-sectional structure diagram of the third embodiment taken along a line 6-6 of FIG. 5.

Next, the apparatus including a structure illustrated in FIGS. 5 and 6 will be described as a third embodiment of the solid-state imaging apparatus of the present invention. FIG. 6 is a cross-sectional structure diagram of pixels corresponding to FIG. 5 here.

Also the present embodiment is suitable to a pixel having a small pixel pitch similarly to the second embodiment. As illustrated in FIG. 5, a part of the fifth semiconductor region 107 is situated at a position distant from the first semiconductor region 103 constituting a photodiode and the third semiconductor region 105 functioning as the source and drain regions of MOS transistors. In comparison with the width of the fifth semiconductor region 107 of first embodiment, the width of the fifth semiconductor region 107 of the present embodiment becomes narrower. In the present embodiment, the fifth semiconductor region 107 is arranged so as not to overlap with the fourth semiconductor region 106 in the width direction. The degree of the suppression of the escapes of the signal charges into the adjacent pixels is in proportion to the formula (1), the impurity concentration is made to be higher in proportion to the width. The structure enables the realization of the solid-state imaging apparatus having smaller pixels with keeping the same color mixing and blooming suppressing effect as that of the first embodiment.

(Application to Camera Main Body)

Figure 8:
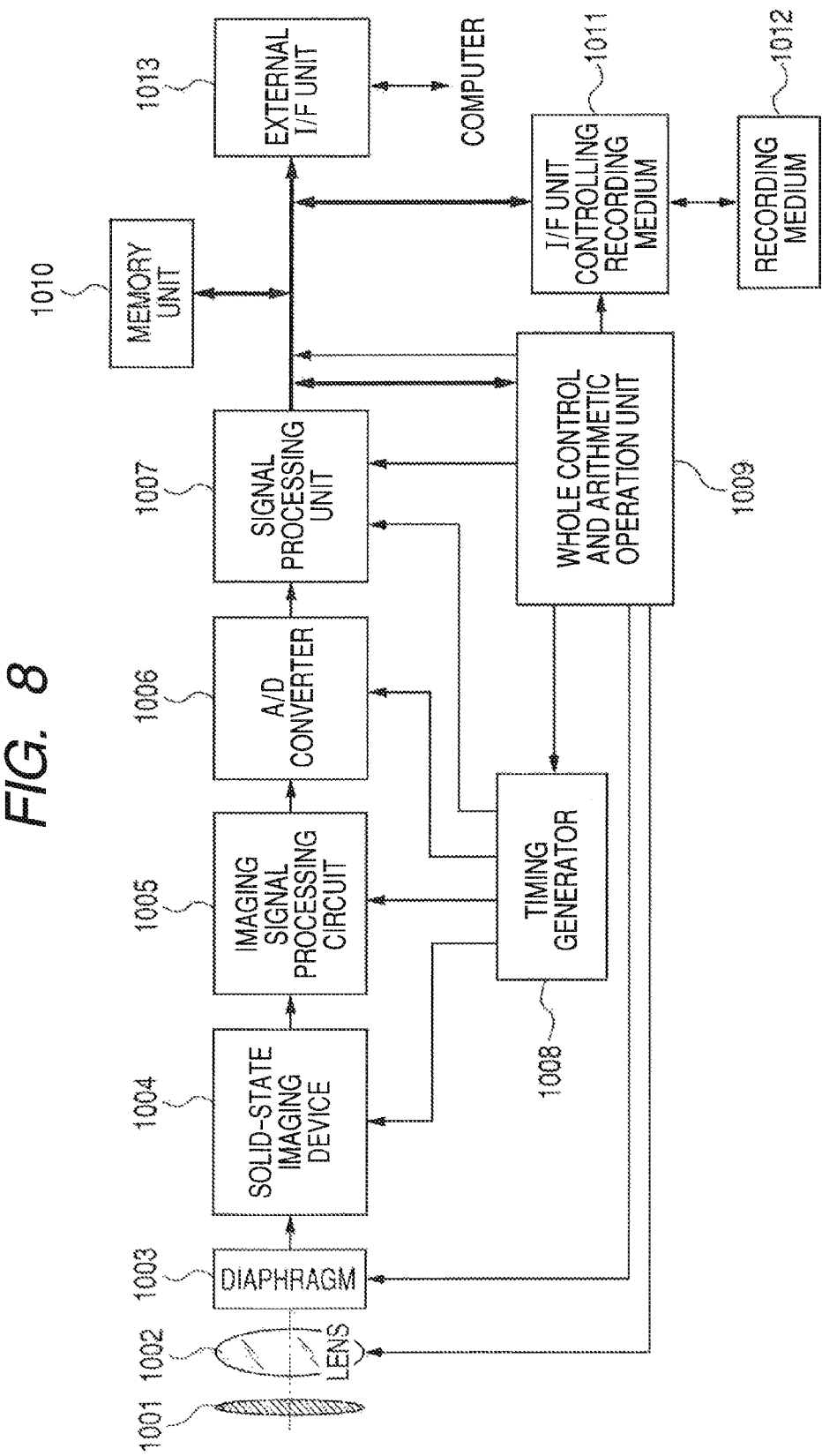
FIG. 8 is an example of a block diagram in the case of applying a solid-state imaging apparatus according to the present invention to a camera.

FIG. 8 is an example of a circuit block diagram illustrating the case of applying the solid-state imaging apparatus of the present invention to a camera.

A shutter 1001 is situated in front of a taking lens 1002, which is an optical member, and the shutter 1001 controls an exposure. Next, a diaphragm 1003 controls a light quantity as the occasion demands, and an object image is focused on the light receiving surface of the solid-state imaging apparatus 1004. The signal output from the solid-state imaging apparatus 1004 is processed by an imaging signal processing circuit 1005, and is converted from an A/D converter 1006 from an analog signal into a digital signal. The output digital signal is further subjected to an arithmetic operation processing by a signal processing unit 1007. The processed digital signal is accumulated in a memory unit 1010, and is transmitted to external equipment through an external I/F unit 1013. The solid-state imaging apparatus 1004, the imaging signal processing circuit 1005, the A/D converter 1006, and the signal processing unit 1007 are severally controlled by a timing generator 1008, and the whole system is controlled by a whole control and arithmetic operation unit 1009. In order to record an image in a recording medium 1012, an output digital signal is recorded through an I/F unit 1011 controlling a recording medium, which I/F unit 1011 is controlled by the whole control and arithmetic operation unit 1009.

According to the present invention, in a solid-state imaging apparatus having an APS structure, the optimum P type element isolation diffusion layer structure is provided according to the depth and concentration of a P type well, and blooming and color mixing can be suppressed even if the sensitivity of a photodiode is improved.

Incidentally, any of the embodiments mentioned above is only an example of the concretization at the time of implementing the present invention, and the scope of the present invention must not be interpreted to be limited by these embodiments. That is, the present invention can be implemented in various forms without departing from the scope and the principal features thereof.

This application claims the benefit of Japanese Patent Application No. 2008-094999, filed Apr. 1, 2008, which is hereby incorporated by reference herein in its entirety.

The invention claimed is:

1. A solid-state imaging apparatus comprising:
a plurality of pixels, each including:
   a photoelectric converting portion for converting incident light into signal charges, and
   a transferring portion for transferring the signal charges from the photoelectric converting portion, wherein
the photoelectric converting portion and the transferring portion are arranged on a semiconductor substrate,
the photoelectric converting portion includes a first semiconductor region of a first conductivity type for accumulating the signal charges and a second semiconductor region of a second conductivity type forming a PN junction with the first semiconductor region,
a third semiconductor region of the first conductivity type is arranged between adjacent first semiconductor regions,
a fourth semiconductor region of the second conductivity type and of an impurity concentration higher than that of the second semiconductor region is arranged between the first and third semiconductor regions, and
a fifth semiconductor region of the second conductivity type arranged under the third semiconductor region and extending to the substrate or a neighborhood thereof, the fifth semiconductor region having an impurity concentration at any depth higher than that of the second semiconductor region at the same depth, the fifth semiconductor region having an impurity concentration profile of a first impurity concentration peak at a region closest to a top surface of the semiconductor substrate, a second impurity concentration peak at a region more distant from the top surface of the semiconductor substrate than the first impurity concentration peak, and a third impurity concentration peak between the first and second impurity concentration peaks, such that the impurity concentrations of the impurity concentration peaks decrease with decreasing distance from the top surface of the semiconductor substrate.

2. The solid-state imaging apparatus according to claim 1, wherein the fifth semiconductor region has a width in a direction of depth larger than that of the fourth semiconductor region, and has an impurity concentration higher than that of the fourth semiconductor region.

3. The solid-state imaging apparatus according to claim 1, wherein the fifth semiconductor region has a width gradually increasing as a depth increases.

4. The solid-state imaging apparatus according to claim 1, wherein the fifth semiconductor region is arranged so as not to overlap with the fourth semiconductor region in a width direction.

5. The solid-state imaging apparatus according to claim 1, each pixel comprising further comprising
  an amplification transistor for amplifying the signal according to the signal charges generated in the photoelectric converting portion, wherein
  the third semiconductor region forms a drain region of the amplification transistor.

6. The solid-state imaging apparatus according to claim 5, wherein
  the amplification transistor has an input terminal to which a floating diffusion region is connected, and
  the fourth and fifth semiconductor regions are arranged so as to surround the photoelectric converting portion and the floating diffusion region.

7. The solid-state imaging apparatus according to claim 1, wherein
  the fifth semiconductor region is arranged deeper than the deepest portion of the second semiconductor region.

8. A camera comprising:
  a solid-state imaging apparatus;
  a signal processing circuit for processing a signal output from the solid-state imaging apparatus; and
  an optical member for focusing an image of an object onto a light receiving surface of the solid-state imaging apparatus,
  wherein said solid-state imaging apparatus comprises a plurality of pixels, each including:
  a photoelectric converting portion for converting incident light into signal charges, and
  a transferring portion for transferring the signal charges from the photoelectric converting portion, wherein
  the photoelectric converting portion and the transferring portion are arranged on a semiconductor substrate,
  the photoelectric converting portion includes a first semiconductor region of a first conductivity type for accumulating the signal charges and a second semiconductor region of a second conductivity type forming a PN junction with the first semiconductor region,
  a third semiconductor region of the first conductivity type is arranged between adjacent first semiconductor regions,
  a fourth semiconductor region of the second conductivity type and of an impurity concentration higher than that of the second semiconductor region is arranged between the first and third semiconductor regions, and
  a fifth semiconductor region of the second conductivity type arranged under the third semiconductor region and extending to the substrate or a neighborhood thereof, the fifth semiconductor region having an impurity concentration at any depth higher than that of the second semiconductor region at the same depth, the fifth semiconductor region having an impurity concentration profile of a first impurity concentration peak at a region closest to a top surface of the semiconductor substrate, a second impurity concentration peak at a region more distant from the top surface of the semiconductor substrate than the first impurity concentration peak, and a third impurity concentration peak between the first and second impurity concentration peaks, such that the impurity concentrations of the impurity concentration peaks decrease with decreasing distance from the top surface of the semiconductor substrate.

9. The solid-state imaging apparatus according to claim 1, wherein the fourth semiconductor region forms an element isolation structure together with an element isolation portion formed from an insulator.

* * * * *